(12) United States Patent
Murai et al.

(10) Patent No.: US 10,714,404 B2
(45) Date of Patent: Jul. 14, 2020

(54) SEMICONDUCTOR DEVICE

(71) Applicant: Mitsubishi Electric Corporation, Tokyo (JP)

(72) Inventors: Ryoji Murai, Fukuoka (JP); Mitsunori Aiko, Tokyo (JP); Takaaki Shirasawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/779,617

(22) PCT Filed: Jan. 29, 2016

(86) PCT No.: PCT/JP2016/052595
§ 371 (c)(1),
(2) Date: May 29, 2018

(87) PCT Pub. No.: WO2017/130370
PCT Pub. Date: Aug. 3, 2017

(65) Prior Publication Data
US 2018/0350713 A1    Dec. 6, 2018

(51) Int. Cl.
*H01L 23/367*    (2006.01)
*H01L 23/36*    (2006.01)
(Continued)

(52) U.S. Cl.
CPC ............ *H01L 23/367* (2013.01); *H01L 23/36* (2013.01); *H01L 23/50* (2013.01); *H01L 23/473* (2013.01); *H01L 23/49562* (2013.01)

(58) Field of Classification Search
CPC ....... H01L 23/367; H01L 23/36; H01L 23/50; H01L 23/473; H01L 23/49562
See application file for complete search history.

(56) References Cited

U.S. PATENT DOCUMENTS 7,772,709 B2 * 8/2010 Ueda .................... H01L 21/565
257/787
9,484,927 B2 * 11/2016 Aiko ...................... H01L 23/34
(Continued)

FOREIGN PATENT DOCUMENTS

DE    603 17 270 T2    8/2008
DE    11 2009 005 394 T5    9/2012
(Continued)

OTHER PUBLICATIONS

International Search Report issued in PCT/JP2016/052595; dated Apr. 12, 2016.
(Continued)

*Primary Examiner* — Savitri Mulpuri
(74) *Attorney, Agent, or Firm* — Studebaker & Brackett PC

(57) ABSTRACT

A technique disclosed in the Description relates to a technique for improving the heat dissipation capability of a semiconductor element and the heat dissipation capability of a lead electrode without increasing the size of a product. A semiconductor device of the technique includes the following: a semiconductor element; a lead electrode having a lower surface connected to an upper surface of the semiconductor element at one end of the lead electrode, the lead electrode being an external terminal; a cooling mechanism disposed on a lower surface side of the semiconductor element; and a heat dissipation mechanism provided to be thermally joined between the lower surface of the lead electrode and the cooling mechanism, the lower surface being more adjacent to an other-end side of the lead electrode than the one end, the heat dissipation mechanism including at least one insulating layer.

13 Claims, 5 Drawing Sheets

(51) Int. Cl.
H01L 23/50 (2006.01)
*H01L 23/473* (2006.01)
*H01L 23/495* (2006.01)

(56) References Cited

U.S. PATENT DOCUMENTS

| | | | |
|---|---|---|---|
| 2004/0012064 | A1 | 1/2004 | Yoshizaki et al. |
| 2006/0192253 | A1* | 8/2006 | Okumura .......... H01L 23/49827 257/378 |
| 2012/0228757 | A1 | 9/2012 | Kitami et al. |
| 2013/0181228 | A1 | 7/2013 | Usui et al. |
| 2015/0003016 | A1* | 1/2015 | Miyamoto ............ H01L 23/473 361/701 |
| 2019/0199224 | A1* | 6/2019 | Yukawa ................ H02M 3/156 |

FOREIGN PATENT DOCUMENTS

| | | |
|---|---|---|
| JP | 2000-058746 A | 2/2000 |
| JP | 2005-064441 A | 3/2005 |
| JP | 2006-237429 A | 9/2006 |
| JP | 2008-212977 A | 9/2008 |
| JP | 2010-114116 A | 5/2010 |
| JP | 2013-065836 A | 4/2013 |
| JP | 2013-149730 A | 8/2013 |

OTHER PUBLICATIONS

International Preliminary Report on Patentability issued in corresponding International Application No. PCT/JP2016/052595; dated Aug. 9, 2018.
An Office Action; "Notification of Reasons for Refusal," issued by the Japanese Patent Office dated Jan. 15, 2019, which corresponds to Japanese Patent Application No. 2017-563488 and is related to U.S. Appl. No. 15/779,617; with English language translation.
An Office Action mailed by the German Patent Office dated Apr. 21, 2020, which corresponds to German Patent Application No. 11 2016 006 331.8 and is related to U.S. Appl. No. 15/779,617.

* cited by examiner

F I G. 1 3
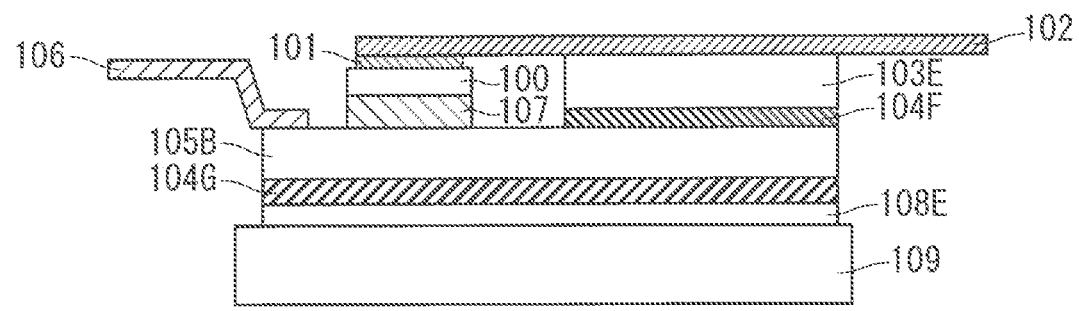

SEMICONDUCTOR DEVICE

TECHNICAL FIELD

The Description discloses a technique that relates to inverter systems (power semiconductor devices) included in, for instance, hybrid motor vehicles powered by engines and motors, or industrial appliances.

BACKGROUND ART

The capacity of a current flowing through a power module has increased. Accordingly, a lead electrode that is an external terminal needs to have a large area or a large area in which the lead electrode is joined to an external electrode so as not to generate heat. Such a configuration unfortunately involves a large package of a product as a whole. The power module increasingly needs to have high performance, have high endurance, and be miniaturized; hence the large package of the product as a whole resulting from the large capacity of the current is incompatible with a need for a miniaturized product.

In a conventional semiconductor device, heat generated in a semiconductor element is dissipated through solder, a heat spreader, an insulating layer, and a heat dissipation material, all of which are disposed below the semiconductor element. On the other hand, the external terminal or the lead electrode connected above the semiconductor element through solder includes no heat dissipation mechanism. Hence, heat generated in the semiconductor element or heat generated in the lead electrode itself causes the lead electrode to have a high temperature. The lead electrode is expected to have a higher temperature as the capacity of the current increases. To prevent the heat generation of the lead electrode, the lead electrode needs to have a large width or a large thickness.

Patent document 1 discloses one example of a technique for improving the heat dissipation capability of the semiconductor element and the heat dissipation capability of the lead electrode. In this technique, an insulating substrate is disposed on an upper surface of the external terminal connected to the semiconductor element, and is exposed to the outside of a module; this helps heat to be dissipated from an upper surface of the semiconductor element, thereby preventing the heat generation of the external terminal.

PRIOR ART DOCUMENT

Patent Document

Patent Document 1: Japanese Patent Application Laid-Open No. 2013-149730

SUMMARY

Problem to be Solved by the Invention

Applying the aforementioned technique involves an increase in thickness of the module. This hinders the miniaturization of the product. This application also requires both surfaces of the semiconductor element to be provided with cooling structures. This results in a large product, and also results in complex process steps when the product is incorporated in an inverter system.

The technique disclosed in the Description has been made to solve these problems, and relates to a technique for improving the heat dissipation capability of a semiconductor element and the heat dissipation capability of a lead electrode without increasing the size of a product.

Means to Solve the Problem

A semiconductor device according to one aspect of the technique disclosed in the Description includes the following: a semiconductor element; a lead electrode having a lower surface connected to an upper surface of the semiconductor element at one end of the lead electrode, the lead electrode being an external terminal; a cooling mechanism disposed on a lower surface side of the semiconductor element; and a heat dissipation mechanism provided to be thermally joined between the lower surface of the lead electrode and the cooling mechanism, the lower surface being more adjacent to an other-end side of the lead electrode than the one end, the heat dissipation mechanism including at least one insulating layer.

Effects of the Invention

A semiconductor device according to one aspect of the technique disclosed in the Description includes the following: a semiconductor element; a lead electrode having a lower surface connected to an upper surface of the semiconductor element at one end of the lead electrode, the lead electrode being an external terminal; a cooling mechanism disposed on a lower surface side of the semiconductor element; and a heat dissipation mechanism provided to be thermally joined between the lower surface of the lead electrode and the cooling mechanism, the lower surface being more adjacent to an other-end side of the lead electrode than the one end, the heat dissipation mechanism including at least one insulating layer. Such a configuration improves the heat dissipation capability of the semiconductor element and the heat dissipation capability of the lead electrode without increasing the size of the product.

These and other objects, features, aspects and advantages of the Description will become more apparent from the following detailed description of the Description when taken in conjunction with the accompanying drawings.

BRIEF DESCRIPTION OF DRAWINGS

FIG. 13 is a schematic cross-sectional view of a structure for achieving a semiconductor device according to an embodiment.

DESCRIPTION OF EMBODIMENT(S)

The embodiments will be described with reference to the accompanying drawings. The drawings are schematic. Thus, mutual relationships between the sizes and positions of images that are illustrated in different drawings are not necessarily exact, and thus can be changed as appropriate. Throughout the following description, like components are denoted by the same symbols, and are also provided with the same names and the same functions. Hence, the detailed description of the like components can be omitted.

Throughout the following description, any terms, such as "top", "under", "left", "right", "side", "bottom", "front", and "back" that indicate specific positions and specific directions, are used for the sake of easy understanding of the embodiments. These terms thus have nothing to do with actual directions when the embodiments are actually implemented.

First Embodiment

The following describes a semiconductor device according to a first embodiment.

<Configuration of Semiconductor Device>

Figure 1:
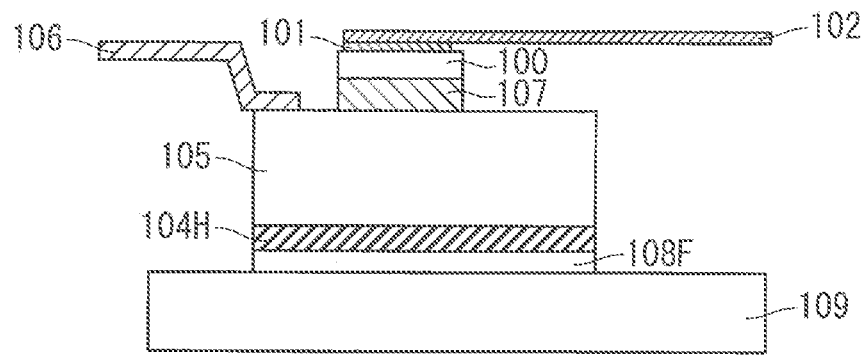
FIG. 1 is a schematic cross-sectional view of a structure for achieving a semiconductor device according to an embodiment.

FIG. 1 is a schematic cross-sectional view of a structure for achieving the semiconductor device according to the embodiment. As illustrated in FIG. 1, the semiconductor device includes the following: a semiconductor element 100; a lead electrode 102 connected to an upper surface of the semiconductor element 100 through solder 101, the lead electrode 102 being an external terminal; a heat spreader 105 connected to a lower surface of the semiconductor element 100 through solder 107; a lead electrode 106 connected to an upper surface of the heat spreader 105; an insulating layer 104H connected to a lower surface of the heat spreader 105; a heat dissipation material 108F connected to a lower surface of the insulating layer 104H; and a cooling mechanism 109 connected to a lower surface of the heat dissipation material 108F.

In the structure illustrated in FIG. 1, heat generated in the semiconductor element 100 is dissipated through the solder 107, the heat spreader 105, the insulating layer 104H, and the heat dissipation material 108F, all of which are disposed below the semiconductor element 100. On the other hand, the lead electrode 102, connected above the semiconductor element 100 through the solder 101, has no heat dissipation mechanism. Thus, the lead electrode 102 has a high temperature due to the heat generation of the semiconductor element 100 or the heat generation of the lead electrode 102 itself. The lead electrode 102, which is expected to have a higher temperature as the capacity of a current increases, needs to have a large width or a large thickness for instance, to avoid its heat generation.

Figure 2:
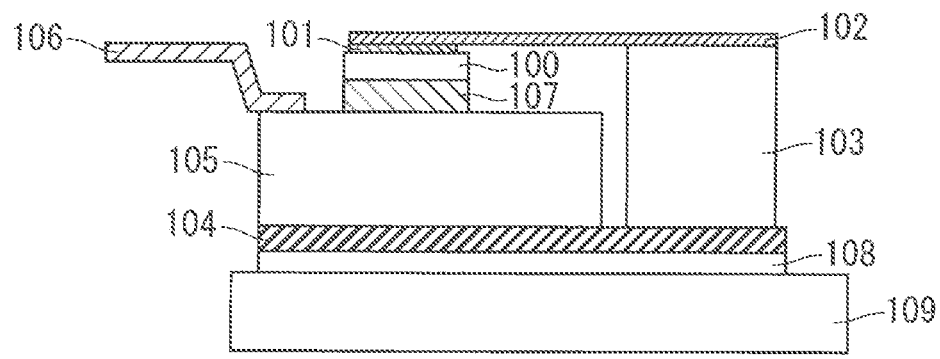
FIG. 2 is a schematic cross-sectional view of the structure for achieving the semiconductor device according to the embodiment.

FIG. 2 is a schematic cross-sectional view of the structure for achieving the semiconductor device according to the embodiment. As illustrated in FIG. 2, the semiconductor device includes the following: the semiconductor element 100; the lead electrode 102 having a lower surface connected to an upper surface of the semiconductor element 100 through the solder 101 at one end of the lead electrode 102; a heat dissipation block 103 connected to the lower surface of the lead electrode 102, the lower surface being more adjacent to an other-end side of the lead electrode 102 than the one end; an insulating layer 104 at least partly connected to a lower surface of the heat dissipation block 103; and a heat dissipation material 108 connected to a lower surface of the insulating layer 104. The semiconductor device further includes the heat spreader 105 connected to the lower surface of the semiconductor element 100 through the solder 107, and the lead electrode 106 connected to the upper surface of the heat spreader 105. The insulating layer 104 is connected to the lower surface of the heat spreader 105. Here, the insulating layer 104 continuously extends from the lower surface of the heat spreader 105 to the lower surface of the heat dissipation block 103. That is, the insulating layer 104 includes a portion on the lower surface of the heat spreader 105 and a portion on the lower surface of the heat dissipation block 103, these portions being continuously formed. The semiconductor device further includes the cooling mechanism 109 connected to a lower surface of the heat dissipation material 108 on a lower surface side of the semiconductor element 100. Here, the heat dissipation block 103, the insulating layer 104, and the heat dissipation material 108 are thermally joined to each other, and are regarded as a heat dissipation mechanism disposed between the lower surface of the lead electrode 102 and the cooling mechanism 109, the lower surface being more adjacent to the other-end side of the lead electrode 102 than the one end of the lead electrode 102.

An example of the semiconductor element 100 is a semiconductor chip, such as a metal-oxide-semiconductor field-effect transistor (MOSFET) or an insulated gate bipolar transistor (IGBT). Examples of the heat dissipation material 108, the heat dissipation block 103, and the heat spreader 105 include a metal, such as Cu, Ni, Al, and Mo, an alloy thereof, and a stacked structure including the metal and the alloy. An example of the cooling mechanism 109 is a structure containing a fin structure.

The heat generated in the semiconductor element 100 is dissipated from the lower surface of the semiconductor element 100 to the cooling mechanism 109 through the solder 107, the heat spreader 105, the insulating layer 104, and the heat dissipation material 108. Further, the heat generated in the semiconductor element 100 is dissipated from the upper surface of the semiconductor element 100 to the cooling mechanism 109 through the solder 101, the lead electrode 102, the heat dissipation block 103, and the heat dissipation material 108.

The heat, which passes through these paths, is dissipated from both upper and lower surfaces of the semiconductor element 100 to the cooling mechanism 109. In addition, heat generated from the lead electrode 102 itself during the passage of the current is dissipated to the cooling mechanism 109 through the heat dissipation block 103, the insulating layer 104, and the heat dissipation material 108. This prevents a rise in temperature of the lead electrode 102.

The heat dissipation block 103 can have a larger thickness than the heat spreader 105. This eliminates the need to bend the lead electrode 102. Examples of the cooling mechanism 109 include the following: the cooling mechanism 109 connected to the heat dissipation material 108 with heat dissipation grease and an air-cooling plate interposed therebetween; the cooling mechanism connected to the heat dissipation material 108 with the heat dissipation grease and a water-cooling plate interposed therebetween; and the cooling mechanism 109 directly connected to the heat dissipation material 108.

Second Embodiment

The following describes a semiconductor device according to a second embodiment. Identical reference symbols are used to denote identical components between the semiconductor device according to the aforementioned embodiment and the semiconductor device according to the second embodiment; identical components will be thus not elaborated.

<Configuration of Semiconductor Device>

Figure 3:
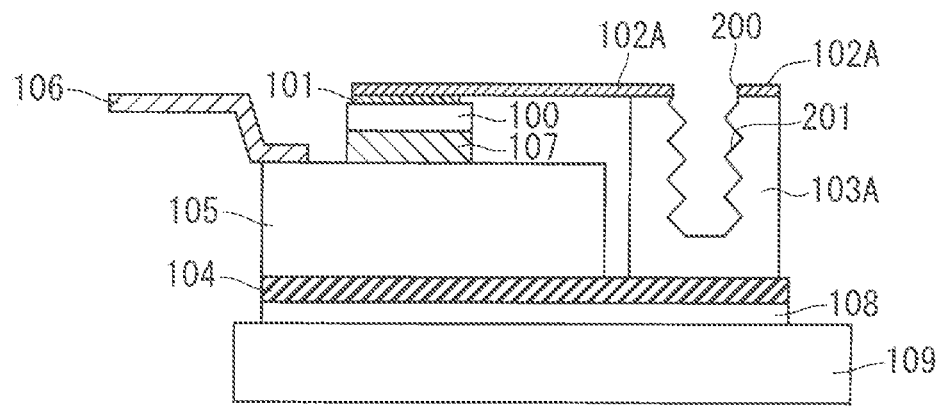
FIG. 3 is a schematic cross-sectional view of a structure for achieving a semiconductor device according to an embodiment.

FIG. 3 is a schematic cross-sectional view of a structure for achieving the semiconductor device according to the embodiment. As illustrated in FIG. 3, the semiconductor device includes the following: a semiconductor element 100; a lead electrode 102A connected to an upper surface of the semiconductor element 100 through solder 101; a heat dissipation block 103A connected to a lower surface of the lead electrode 102A; an insulating layer 104 connected to a lower surface of the heat dissipation block 103A; and a heat dissipation material 108. The semiconductor device further includes a heat spreader 105 and a lead electrode 106. The insulating layer 104 is connected to a lower surface of the heat spreader 105. The semiconductor device further includes a cooling mechanism 109 connected to a lower surface of the heat dissipation material 108.

The lead electrode 102A and the heat dissipation block 103A each have a shape so as to receive a screw for fastening an external busbar (not shown). To be specific, the lead electrode 102A has a hole 200 penetrating from an upper surface of the lead electrode 102A to the lower surface of the lead electrode 102A. Moreover, the heat dissipation block 103A has an upper surface provided with a screw hole 201 that communicates with the penetrating hole 200 of the lead electrode 102A, the screw hole 201 having side surfaces cut into a screw shape.

Such a configuration enables heat to be dissipated from both upper and lower surfaces of the semiconductor element 100 to the cooling mechanism 109. In addition, heat generated from the lead electrode 102A itself during the passage of a current, and heat generated in a contact portion between the lead electrode 102A and the external busbar are dissipated to the cooling mechanism 109 through the heat dissipation block 103A, the insulating layer 104, and the heat dissipation material 108. This prevents a rise in temperature of the lead electrode 102A.

Third Embodiment

The following describes a semiconductor device according to a third embodiment. Identical reference symbols are used to denote identical components between the semiconductor devices according to aforementioned embodiments and the semiconductor device according to the third embodiment; identical components will be thus not elaborated.

<Configuration of Semiconductor Device>

Figure 4:
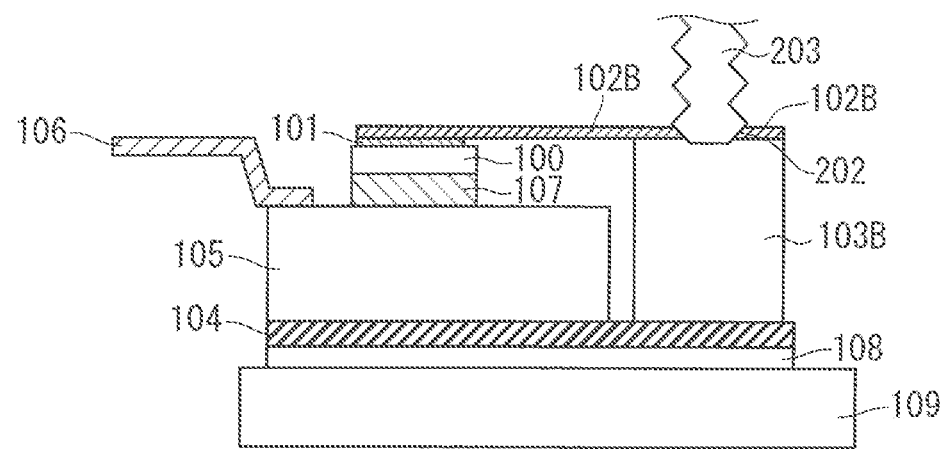
FIG. 4 is a schematic cross-sectional view of a structure for achieving a semiconductor device according to an embodiment.

FIG. 4 is a schematic cross-sectional view of a structure for achieving the semiconductor device according to the embodiment. As illustrated in FIG. 4, the semiconductor device includes the following: a semiconductor element 100; a lead electrode 102B connected to an upper surface of the semiconductor element 100 through solder 101; a heat dissipation block 103B connected to a lower surface of the lead electrode 102B; an insulating layer 104 connected to a lower surface of the heat dissipation block 103B; and a heat dissipation material 108. The semiconductor device further includes a heat spreader 105 and a lead electrode 106. The insulating layer 104 is connected to a lower surface of the heat spreader 105. The semiconductor device further includes a cooling mechanism 109 connected to a lower surface of the heat dissipation material 108.

The lead electrode 102B and the heat dissipation block 103B each have a shape so as to receive a screw for fastening an external busbar (not shown). To be specific, the lead electrode 102B has a hole 202 penetrating from an upper surface of the lead electrode 102B to the lower surface of the lead electrode 102B. Moreover, the heat dissipation block 103B has an upper surface provided with a projection 203 that penetrates the penetrating hole 202 of the lead electrode 102B, the projection 203 having side surfaces cut into a screw shape.

Such a configuration enables heat to be dissipated from both upper and lower surfaces of the semiconductor element 100 to the cooling mechanism 109. In addition, heat generated from the lead electrode 102B itself during the passage of a current, and heat generated in a contact portion between the lead electrode 102B and the external busbar are dissipated to the cooling mechanism 109 through the heat dissipation block 103B, the insulating layer 104, and the heat dissipation material 108. This prevents a rise in temperature of the lead electrode 102B.

Fourth Embodiment

The following describes a semiconductor device according to a fourth embodiment. Identical reference symbols are used to denote identical components between the semiconductor devices according to aforementioned embodiments and the semiconductor device according to the fourth embodiment; identical components will be thus not elaborated.

<Configuration of Semiconductor Device>

Figure 5:
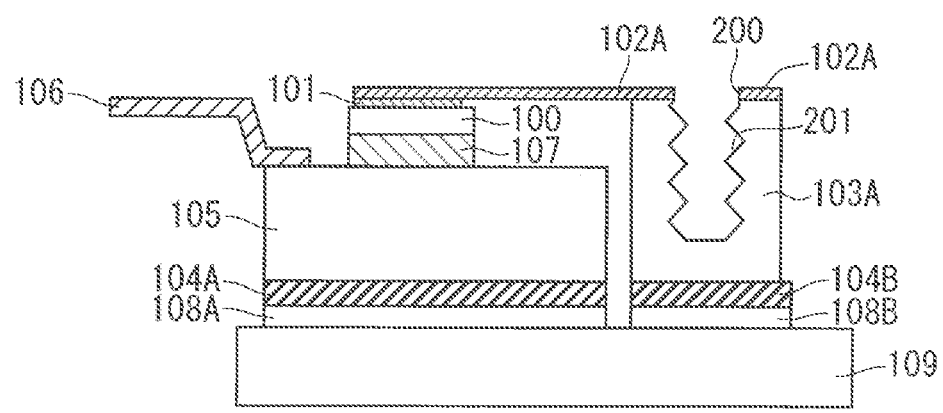
FIG. 5 is a schematic cross-sectional view of a structure for achieving a semiconductor device according to an embodiment.

FIG. 5 is a schematic cross-sectional view of a structure for achieving the semiconductor device according to the embodiment. As illustrated in FIG. 5, the semiconductor device includes the following: a semiconductor element 100; a lead electrode 102A connected to an upper surface of the semiconductor element 100 through solder 101; a heat dissipation block 103A connected to a lower surface of the lead electrode 102A; an insulating layer 104B connected to a lower surface of the heat dissipation block 103A; and a heat dissipation material 108B connected to a lower surface of the insulating layer 104B. The semiconductor device further includes the following: a heat spreader 105 connected to a lower surface of the semiconductor element 100 through solder 107; a lead electrode 106 connected to an upper surface of the heat spreader 105; an insulating layer 104A connected to a lower surface of the heat spreader 105; and a heat dissipation material 108A connected to a lower surface of the insulating layer 104A. The semiconductor device further includes a cooling mechanism 109 connected to a lower surface of the heat dissipation material 108A and a lower surface of the heat dissipation material 108B.

The lead electrode 102A and the heat dissipation block 103A each have a shape so as to receive a screw for fastening an external busbar (not shown). To be specific, the lead electrode 102A has a penetrating hole 200. Moreover, the heat dissipation block 103A has a screw hole 201 that communicates with the penetrating hole 200 of the lead electrode 102A, the screw hole 201 having side surfaces cut into a screw shape. Further, an insulating layer 104A, connected to a lower surface of a heat spreader 105, and the insulating layer 104B, connected to the lower surface of the heat dissipation block 103A, are spaced from each other. Still further, the heat dissipation material 108A, connected to a lower surface of the insulating layer 104A, and the heat dissipation material 108B, connected to the lower surface of the insulating layer 104B, are spaced from each other.

Such a configuration enables heat to be dissipated from both upper and lower surfaces of the semiconductor element 100 to the cooling mechanism 109. In addition, heat generated from the lead electrode 102A itself during the passage of a current, and heat generated in a contact portion between the lead electrode 102A and the external busbar are dissipated to the cooling mechanism 109 through the heat dissipation block 103A, the insulating layer 104B, and the heat dissipation material 108B. This prevents a rise in temperature of the lead electrode 102A. Further, the insulating layer 104A and the insulating layer 104B are spaced from each other; in addition, the heat dissipation material 108A and the heat dissipation material 108B are spaced from each other. This enables the shape for fastening the external busbar to be changed by only changing a structure including the insulating layer 104B and the heat dissipation material 108B independently of a structure on which the semiconductor element 100 is disposed, the structure including the insulating layer 104A and the heat dissipation material 108A. It is noted that the structure illustrated in FIG. 4 may include two separate insulating layers: one is adjacent to the semiconductor element 100; and the other is adjacent to the heat dissipation block 103B. It is also noted that the structure illustrated in FIG. 4 may include two separate heat dissipation materials: one is adjacent to the semiconductor element 100; and the other is adjacent to the heat dissipation block 103B.

Fifth Embodiment

The following describes a semiconductor device according to a fifth embodiment. Identical reference symbols are used to denote identical components between the semiconductor devices according to aforementioned embodiments and the semiconductor device according to the fifth embodiment; identical components will be thus not elaborated.

<Configuration of Semiconductor Device>

Figure 6:
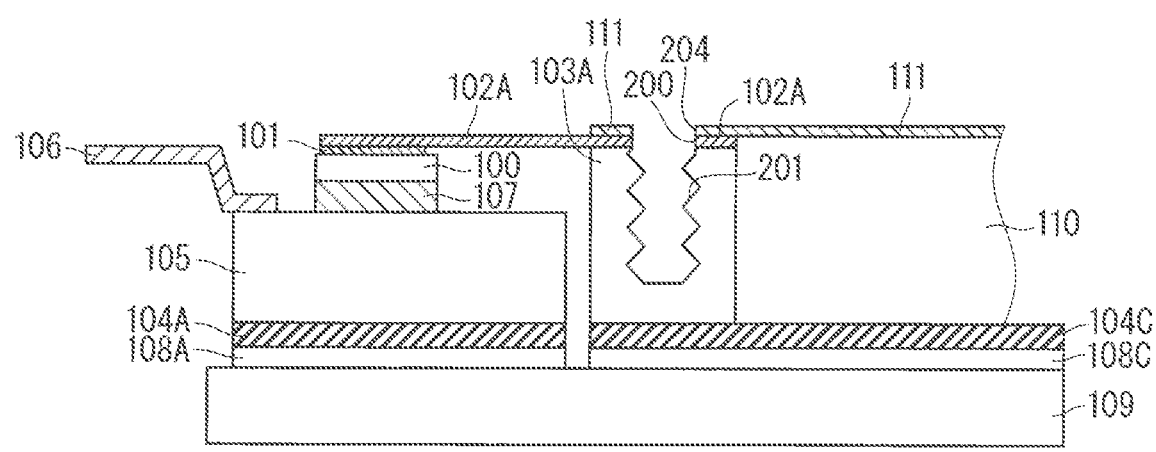
FIG. 6 is a schematic cross-sectional view of a structure for achieving a semiconductor device according to an embodiment.

FIG. 6 is a schematic cross-sectional view of a structure for achieving the semiconductor device according to the embodiment. As illustrated in FIG. 6, the semiconductor device includes the following: a semiconductor element 100; a lead electrode 102A having a lower surface connected to an upper surface of the semiconductor element 100 through solder 101 at one end of the lead electrode 102A; a heat dissipation block 103A connected to the lower surface of the lead electrode 102A, the lower surface being more adjacent to an other-end side of the lead electrode 102A than the one end; an insulating layer 104C connected to a lower surface of the heat dissipation block 103A; and a heat dissipation material 108C connected to a lower surface of the insulating layer 104C. The semiconductor device further includes the following: a heat spreader 105 connected to a lower surface of the semiconductor element 100 through solder 107; a lead electrode 106 connected to an upper surface of the heat spreader 105; an insulating layer 104A connected to a lower surface of the heat spreader 105; and a heat dissipation material 108A connected to a lower surface of the insulating layer 104A. The semiconductor device further includes a cooling mechanism 109 connected to a lower surface of the heat dissipation material 108A and a lower surface of the heat dissipation material 108C.

The semiconductor device further include the following: an external busbar 111 having one end connected to an upper surface of the lead electrode 102A, the upper surface being on an other-end side of the lead electrode 102A; and a heat dissipation block 110 connected to a lower surface of the busbar 111, the lower surface being more adjacent to an other-end side of the busbar 111 than one end of the busbar 111. Here, the heat dissipation block 110 is connected also to an upper surface of the insulating layer 104C, which is connected to the lower surface of the heat dissipation block 103A.

The lead electrode 102A and the heat dissipation block 103A each have a shape so as to receive a screw for fastening the external busbar 111. To be specific, the lead electrode 102A has a penetrating hole 200. Moreover, the heat dissipation block 103A has a screw hole 201 that communicates with the penetrating hole 200 of the lead electrode 102A, the screw hole 201 having side surfaces cut into a screw shape. Further, the external busbar 111 has a penetrating hole 204. The penetrating hole 204 of the external busbar 111 is superposed on the penetrating hole 200 of the lead electrode 102A. Still further, the insulating layer 104A and the insulating layer 104C are spaced from each other. Yet further, the heat dissipation material 108A and the heat dissipation material 108C are spaced from each other. It is noted that the insulating layer 104A and the insulating layer 104C may be continuously formed. It is also noted that the heat dissipation material 108A and the heat dissipation material 108C may be continuously formed.

Such a configuration enables heat to be dissipated from both upper and lower surfaces of the semiconductor element 100 to the cooling mechanism 109. In addition, heat generated from the lead electrode 102A itself during the passage of a current, and heat generated in a contact portion between the lead electrode 102A and the external busbar are dissipated to the cooling mechanism 109 through the heat dissipation block 103A, the external busbar 111, the heat dissipation block 110, the insulating layer 104C, and the heat dissipation material 108C. This prevents a rise in temperature of the lead electrode 102A. Further, the insulating layer 104A and the insulating layer 104C are spaced from each other; in addition, the heat dissipation material 108A and the heat dissipation material 108C are spaced from each other. This enables the shape for fastening the external busbar 111 to be changed by only changing a structure including the insulating layer 104C and the heat dissipation material 108C independently of a structure on which the semiconductor element 100 is disposed, the structure including the insulating layer 104A and the heat dissipation material 108A. Still further, the insulating layer 104C and the heat dissipation material 108C extend to reach the busbar 111 and a lower surface of the heat dissipation block 110. This achieves efficient heat dissipation.

Sixth Embodiment

The following describes a semiconductor device according to a sixth embodiment. Identical reference symbols are used to denote identical components between the semiconductor devices according to aforementioned embodiments and the semiconductor device according to the sixth embodiment; identical components will be thus not elaborated.

<Configuration of Semiconductor Device>

Figure 7:
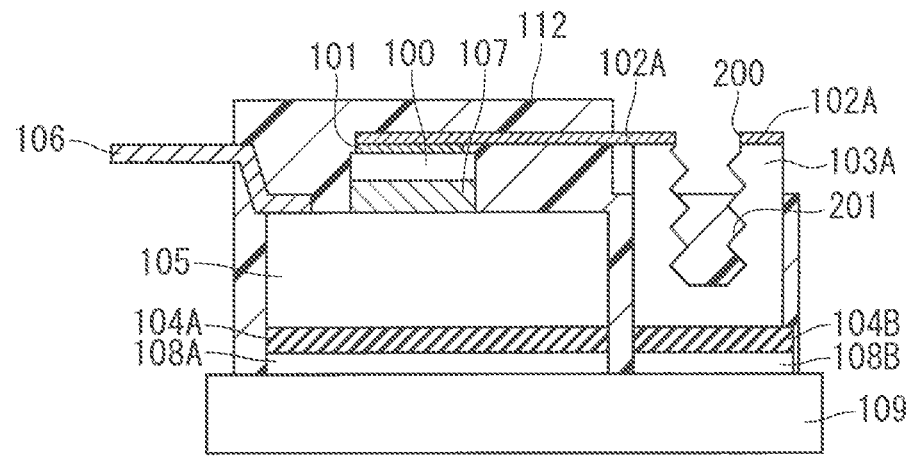
FIG. 7 is a schematic cross-sectional view of a structure for achieving a semiconductor device according to an embodiment.

FIG. 7 is a schematic cross-sectional view of a structure for achieving the semiconductor device according to the embodiment. As illustrated in FIG. 7, the semiconductor device includes a semiconductor element 100, a lead electrode 102A, a heat dissipation block 103A, an insulating layer 104B, and a heat dissipation material 108B. The semiconductor device further includes a heat spreader 105, a lead electrode 106, an insulating layer 104A, and a heat dissipation material 108A. The semiconductor device further includes a cooling mechanism 109 connected to a lower surface of the heat dissipation material 108A and a lower surface of the heat dissipation material 108B.

The lead electrode 102A and the heat dissipation block 103A each have a shape so as to receive a screw for fastening an external busbar (not shown). To be specific, the lead electrode 102A has a penetrating hole 200. Moreover, the heat dissipation block 103A has a screw hole 201 that communicates with the penetrating hole 200 of the lead electrode 102A, the screw hole 201 having side surfaces cut into a screw shape. Still further, the insulating layer 104A and the insulating layer 104B are spaced from each other. Yet further, the heat dissipation material 108A and the heat dissipation material 108B are spaced from each other.

The semiconductor device further includes a resin portion 112 exposing the shape to receive the screw for fastening the external busbar, and covering the entire semiconductor device. To be specific, the resin portion 112 covers at least part of the heat dissipation block 103A and one end of the lead electrode 102A. The resin portion 112 is made of an epoxy resin for instance.

Such a configuration enables heat to be dissipated from both upper and lower surfaces of the semiconductor element 100 to the cooling mechanism 109. In addition, heat generated from the lead electrode 102A itself during the passage of a current, and heat generated in a contact portion between the lead electrode 102A and the external busbar are dissipated to the cooling mechanism 109 through the heat dissipation block 103A, the insulating layer 104B, and the heat dissipation material 108B. This prevents a rise in temperature of the lead electrode 102A. In addition, the semiconductor device, which is covered with the resin portion 112, has high reliability.

Seventh Embodiment

The following describes a semiconductor device according to a seventh embodiment. Identical reference symbols are used to denote identical components between the semiconductor devices according to aforementioned embodiments and the semiconductor device according to the seventh embodiment; identical components will be thus not elaborated.

<Configuration of Semiconductor Device>

Figure 8:
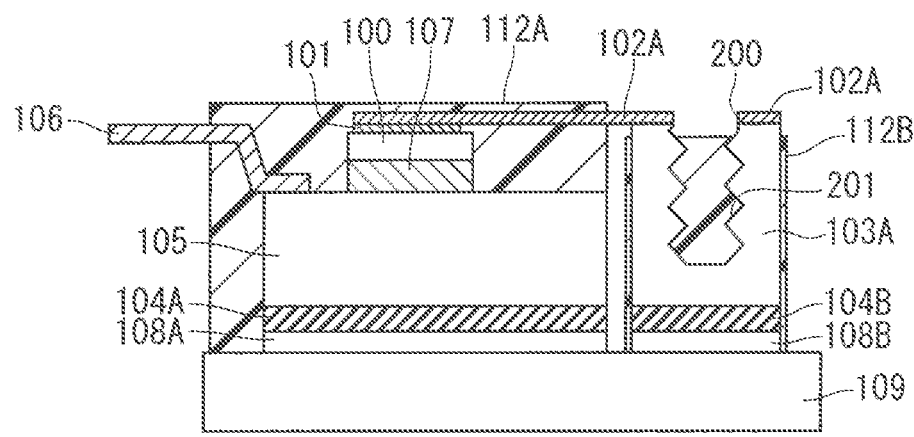
FIG. 8 is a schematic cross-sectional view of a structure for achieving a semiconductor device according to an embodiment.

FIG. 8 is a schematic cross-sectional view of a structure for achieving the semiconductor device according to the embodiment. As illustrated in FIG. 8, the semiconductor device includes a semiconductor element 100, a lead electrode 102A, a heat dissipation block 103A, an insulating layer 104B, and a heat dissipation material 108B. The semiconductor device further includes a heat spreader 105, a lead electrode 106, an insulating layer 104A, and a heat dissipation material 108A. The semiconductor device further includes a cooling mechanism 109 connected to a lower surface of the heat dissipation material 108A and a lower surface of the heat dissipation material 108B.

The lead electrode 102A and the heat dissipation block 103A each have a shape so as to receive a screw for fastening an external busbar (not shown). To be specific, the lead electrode 102A has a penetrating hole 200. Moreover, the heat dissipation block 103A has a screw hole 201 that communicates with the penetrating hole 200 of the lead electrode 102A, the screw hole 201 having side surfaces cut into a screw shape. Still further, the insulating layer 104A and the insulating layer 104B are spaced from each other. Yet further, the heat dissipation material 108A and the heat dissipation material 108B are spaced from each other.

The semiconductor device further includes a resin portion 112A covering the heat dissipation material 108A, the insulating layer 104A, the heat spreader 105, part of the lead electrode 106, solder 107, the semiconductor element 100, solder 101, and part of the lead electrode 102A. Further, the semiconductor device includes a resin portion 112B covering the heat dissipation material 108B, the insulating layer 104B, the heat dissipation block 103A, and the part of lead electrode 102A. The resin portion 112B, covering at least part of the heat dissipation block 103A, and the resin portion 112A, covering one end of the lead electrode 102A, are distant from each other. The resin portion 112A and the resin portion 112B are each made of an epoxy resin for instance.

Such a configuration enables heat to be dissipated from both upper and lower surfaces of the semiconductor element 100 to the cooling mechanism 109. In addition, heat generated from the lead electrode 102A itself during the passage of a current, and heat generated in a contact portion between the lead electrode 102A and the external busbar are dissipated to the cooling mechanism 109 through the heat dissipation block 103A, the insulating layer 104B, and the heat dissipation material 108B. This prevents a rise in temperature of the lead electrode 102A. In addition, the semiconductor device, which is covered with the resin portion 112A and the resin portion 112B, has high reliability. Still further, the resin portion 112A and the resin portion 112B are spaced from each other. This enables the resin portion 112B to be provided in flexible response to a change of a structure including the insulating layer 104B and the heat dissipation material 108B, independently of a structure on which the semiconductor element 100 is disposed, the structure including insulating layer 104A and the heat dissipation material 108A. As a result, a shape for fastening the external busbar is flexibly changed.

Eighth Embodiment

The following describes a semiconductor device according to an eighth embodiment. Identical reference symbols are used to denote identical components between the semiconductor devices according to aforementioned embodiments and the semiconductor device according to the eighth embodiment; identical components will be thus not elaborated.

<Configuration of Semiconductor Device>

Figure 9:
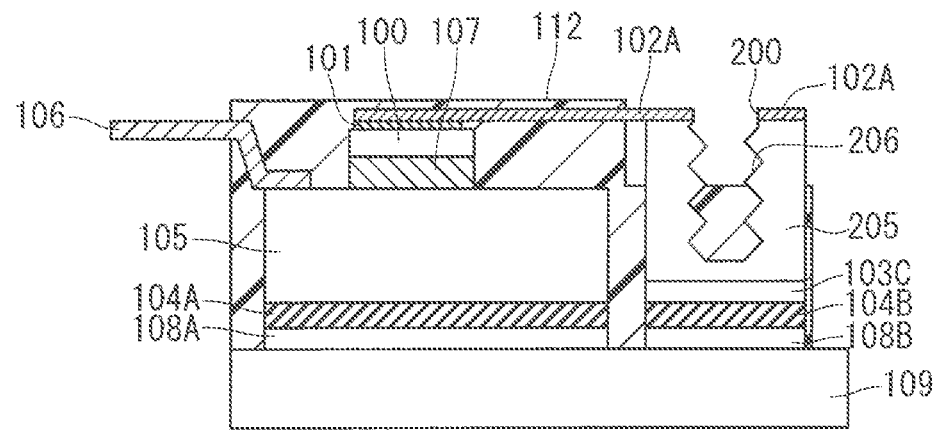
FIG. 9 is a schematic cross-sectional view of a structure for achieving a semiconductor device according to an embodiment.

FIG. 9 is a schematic cross-sectional view of a structure for achieving the semiconductor device according to the embodiment. As illustrated in FIG. 9, the semiconductor device includes the following: a semiconductor element 100; a lead electrode 102A; a nut 205 connected to a lower surface of the lead electrode 102A; a heat dissipation block 103C connected to a lower surface of the nut 205; an insulating layer 104B connected to a lower surface of the heat dissipation block 103C; and a heat dissipation material 108B. The semiconductor device further includes a heat spreader 105, a lead electrode 106, an insulating layer 104A, and a heat dissipation material 108A. The semiconductor device further includes a cooling mechanism 109 connected to a lower surface of the heat dissipation material 108A and a lower surface of the heat dissipation material 108B.

The lead electrode 102A and the nut 205 each have a shape so as to receive a screw for fastening an external busbar (not shown). To be specific, the lead electrode 102A has a hole 200 penetrating from an upper surface of the lead electrode 102A to the lower surface of the lead electrode 102A. Moreover, the nut 205 has a screw hole 206 that communicates with the penetrating hole 200 of the lead electrode 102A, the screw hole 206 having side surfaces cut into a screw shape. Further, the insulating layer 104A and the insulating layer 104B are spaced from each other. Still further, the heat dissipation material 108A and the heat dissipation material 108B are spaced from each other. The semiconductor device further includes a resin portion 112 exposing the shape to receive the screw for fastening the external busbar, and covering the entire semiconductor device. To be specific, the resin portion 12 covers at least part of the nut 205 and one end of the lead electrode 102A. It is noted that the semiconductor device may include two separate resin portions: one is adjacent to the semiconductor element 100; and the other is adjacent to heat dissipation block 103C.

Such a configuration enables heat to be dissipated from both upper and lower surfaces of the semiconductor element 100 to the cooling mechanism 109. In addition, heat generated from the lead electrode 102A itself during the passage of a current, and heat generated in a contact portion between the lead electrode 102A and the external busbar are dissipated to the cooling mechanism 109 through the nut 205, the heat dissipation block 103C, the insulating layer 104B, and the heat dissipation material 108B. This prevents a rise in temperature of the lead electrode 102A. In addition, the semiconductor device, which is covered with the resin portion 112, has high reliability.

The nut 205 is disposed in a location where the external busbar is fastened. This establishes a structure that is resistant under high torque, if any, in fastening to the external busbar.

Ninth Embodiment

The following describes a semiconductor device according to a ninth embodiment. Identical reference symbols are used to denote identical components between the semiconductor devices according to aforementioned embodiments and the semiconductor device according to the ninth embodiment; identical components will be thus not elaborated.

<Configuration of Semiconductor Device>

Figure 10:
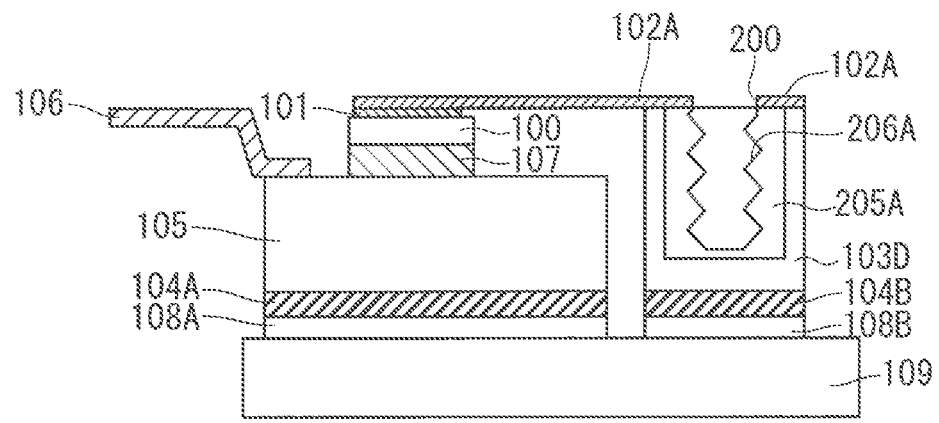
FIG. 10 is a schematic cross-sectional view of a structure for achieving a semiconductor device according to an embodiment.

FIG. 10 is a schematic cross-sectional view of a structure for achieving the semiconductor device according to the embodiment. As illustrated in FIG. 10, the semiconductor device includes the following: a semiconductor element 100; a lead electrode 102A; a nut 205A connected to a lower surface of the lead electrode 102A; a heat dissipation block 103D connected to lower and side surfaces of the nut 205A; an insulating layer 104B connected to a lower surface of the heat dissipation block 103D; and a heat dissipation material 108B. The semiconductor device further includes a heat spreader 105, a lead electrode 106, an insulating layer 104A, and a heat dissipation material 108A. The semiconductor device further includes a cooling mechanism 109 connected to a lower surface of the heat dissipation material 108A and a lower surface of the heat dissipation material 108B.

The lead electrode 102A and the nut 205 each have a shape so as to receive a screw for fastening an external busbar (not shown). To be specific, the lead electrode 102A has a penetrating hole 200. Moreover, the heat dissipation block 203A has a screw hole 206 that communicates with the penetrating hole 200 of the lead electrode 102A, the screw hole 206 having side surfaces cut into a screw shape. Further, the insulating layer 104A and the insulating layer 104B are spaced from each other. Still further, the heat dissipation material 108A and the heat dissipation material 108B are spaced from each other.

Such a configuration enables heat to be dissipated from both upper and lower surfaces of the semiconductor element 100 to the cooling mechanism 109. In addition, heat generated from the lead electrode 102A itself during the passage of a current, and heat generated in a contact portion between the lead electrode 102A and the external busbar are dissipated to the cooling mechanism 109 through the nut 205, the heat dissipation block 103D, the insulating layer 104B, and the heat dissipation material 108B. This prevents a rise in temperature of the lead electrode 102A.

The nut 205 is disposed in a location where the external busbar is fastened. This establishes a structure that is resistant under high torque, if any, in fastening to the external busbar. The heat dissipation block 103D, which is in contact with the side surfaces of the nut 205A as well as the lower surface of the nut 205A, has a higher dissipation capability.

Tenth Embodiment

The following describes a semiconductor device according to a tenth embodiment. Identical reference symbols are used to denote identical components between the semiconductor devices according to aforementioned embodiments and the semiconductor device according to the tenth embodiment; identical components will be thus not elaborated.

<Configuration of Semiconductor Device>

Figure 11:
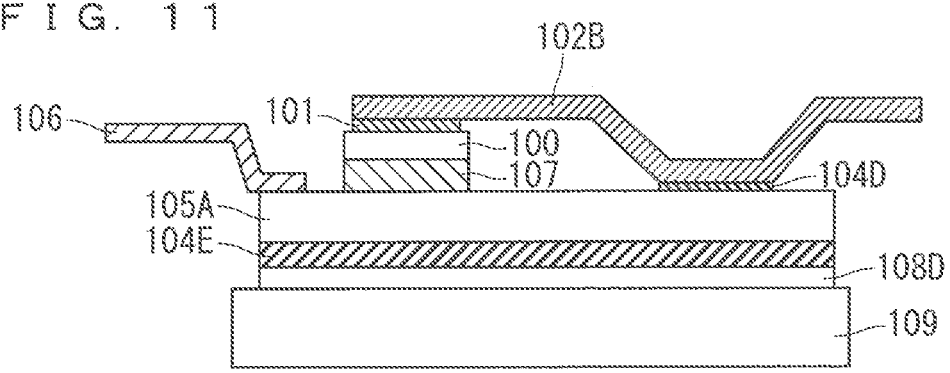
FIG. 11 is a schematic cross-sectional view of a structure for achieving a semiconductor device according to an embodiment.

FIG. 11 is a schematic cross-sectional view of a structure for achieving the semiconductor device according to the embodiment. As illustrated in FIG. 11, the semiconductor device includes the following: a semiconductor element 100; a lead electrode 102B connected to an upper surface of the semiconductor element 100 through solder 101; and an insulating layer 104D connected to a lower surface of the lead electrode 102B. The semiconductor device further includes the following: a heat spreader 105A connected to a lower surface of the semiconductor element 100 through solder 107; a lead electrode 106 connected to an upper surface of the heat spreader 105A; an insulating layer 104E connected to a lower surface of the heat spreader 105A; a heat dissipation material 108D connected to a lower surface of the insulating layer 104E; and a cooling mechanism 109 connected to a lower surface of the heat dissipation material 108D. Here, the insulating layer 104D is connected to the upper surface of the heat spreader 105A. Further, the lead electrode 102B is partly bent downward, and is connected to the insulating layer 104D in this bent location. Here, the insulating layer 104D, the insulating layer 104E, the heat spreader 105A, and the heat dissipation material 108D are thermally joined to each other, and are regarded as a heat dissipation mechanism disposed between the lower surface of the lead electrode 102B and the cooling mechanism 109, the lower surface being more adjacent to an other-end of the lead electrode 102B than one end of the lead electrode 102B.

Such a configuration enables heat to be dissipated from both upper and lower surfaces of the semiconductor element 100 to the cooling mechanism 109. In addition, heat generated from the lead electrode 102B itself during the passage of a current is dissipated to the cooling mechanism 109 through the insulating layer 104D, the heat spreader 105A, the insulating layer 104E, at d the heat dissipation material 108D. This prevents a rise in temperature of the lead electrode 102B.

Eleventh Embodiment

The following describes a semiconductor device according to an eleventh embodiment. Identical reference symbols are used to denote identical components between the semiconductor devices according to aforementioned embodiments and the semiconductor device according to the eleventh embodiment; identical components will be thus not elaborated.

<Configuration of Semiconductor Device>

Figure 12:
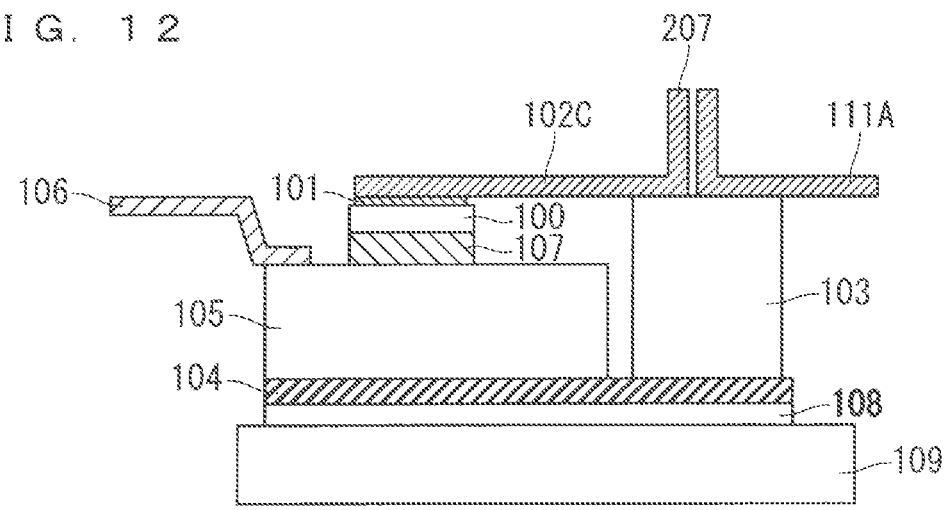
FIG. 12 is a schematic cross-sectional view of a structure for achieving a semiconductor device according to an embodiment.

FIG. 12 is a schematic cross-sectional view of a structure for achieving the semiconductor device according to the embodiment. As illustrated in FIG. 12, the semiconductor device includes the following: a semiconductor element 100; a lead electrode 102C connected to an upper surface of the semiconductor element 100 through solder 101; a heat dissipation block 103 connected to a lower surface of the lead electrode 102C; an insulating layer 104; and a heat dissipation material 108. The semiconductor device further includes a heat spreader 105 and a lead electrode 106. The insulating layer 104 is connected to a lower surface of the heat spreader 105. The semiconductor device further includes a cooling mechanism 109 connected to a lower surface of the heat dissipation material 108.

The semiconductor device further includes an external busbar 111A welded to the lead electrode 102C, and connected to an upper surface of the heat dissipation block 103. Here, the lead electrode 102C has a projection 207 in a welded location between the lead electrode 102C and the external busbar 111A, the projection 207 projecting from the heat dissipation block 103.

Such a configuration enables heat to be dissipated from both upper and lower surfaces of the semiconductor element 100 to the cooling mechanism 109. In addition, heat generated from the lead electrode 102C itself during the passage of a current is dissipated to the cooling mechanism 109 through the heat dissipation block 103, the insulating layer 104, and the heat dissipation material 108. This prevents a rise in temperature of the lead electrode 102C.

Twelfth Embodiment

The following describes a semiconductor device according to a twelfth embodiment. Identical reference symbols are used to denote identical components between the semiconductor devices according to aforementioned embodiments and the semiconductor device according to the twelfth embodiment; identical components will be thus not elaborated.

<Configuration of Semiconductor Device>

FIG. 13 is a schematic cross-sectional view of a structure for achieving the semiconductor device according to the embodiment. As illustrated in FIG. 13, the semiconductor device includes the following: a semiconductor element 100; a lead electrode 102; a heat dissipation block 103E directly connected to a lower surface of the lead electrode 102, the lower surface being more adjacent to an other-end side of the lead electrode 102 than one end of the lead electrode 102; and an insulating layer 104F connected to a lower surface of the heat dissipation block 103E. The semiconductor device further includes the following: a heat spreader 105B connected to a lower surface of the semiconductor element 100 through solder 107; a lead electrode 106 connected to an upper surface of the heat spreader 105B; an insulating layer 104G connected to a lower surface of the heat spreader 105B; a heat dissipation material 108E connected to a lower surface of the insulating layer 104G; and a cooling mechanism 109 connected to a lower surface of the heat dissipation material 108E. Here, the insulating layer 104F is connected to the upper surface of the heat spreader 105B. It is noted that the lead electrode 102 may be bent toward the heat dissipation block 103E as illustrated in FIG. 11.

Such a configuration enables heat to be dissipated from both upper and lower surfaces of the semiconductor element 100 to the cooling mechanism 109. In addition, heat generated from the lead electrode 102 itself during the passage of a current is dissipated to the cooling mechanism 109 through the heat dissipation block 103E, the insulating layer 104F, the heat spreader 105B, the insulating layer 104G, and the heat dissipation material 108E. This prevents a rise in temperature of the lead electrode 102.

Effects of Aforementioned Embodiments

The following describes effects of the aforementioned embodiments. Although these effects are based on specific configurations that are described in the aforementioned embodiments, to an extent that like effects are obtained, these specific configurations may be replaced with different specific embodiments that are described in the Description. The replacement may be done over several embodiments. That is, combinations of the individual configurations, described in the different embodiments, may bring like effects.

According to the aforementioned embodiment, the semiconductor device includes the following: the semiconductor element 100; the lead electrode 102 having a lower surface connected to an upper surface of the semiconductor element 100 at one end of the lead electrode 102, the lead electrode 102 being an external terminal; the cooling mechanism 109 disposed on a lower surface side of the semiconductor element 100; and the heat dissipation mechanism provided to be thermally joined between the lower surface of the lead electrode 102 and the cooling mechanism 109, the lower surface being more adjacent to an other-end side of the lead electrode 102 than the one end, the heat dissipation mechanism including at least one insulating layer (i.e., the insulating layer 104). Further, the semiconductor device includes the following; the semiconductor element 100; the lead electrode 102B having a lower surface connected to an upper surface of the semiconductor element 100 at one end of the lead electrode 102B; the cooling mechanism 109 disposed on a lower surface side of the semiconductor element 100; and the heat dissipation mechanism provided to be thermally joined between the lower surface of the lead electrode 102B and the cooling mechanism 109, the lower surface being more adjacent to an other-end of the lead electrode 102B than the one end, the heat dissipation mechanism including at least one insulating layer (i.e., the insulating layer 104D or the insulating layer 104E).

Such configurations improve the heat dissipation capability of the semiconductor element 100 and the heat dissipation capability of the lead electrodes, which are the external terminals, without increasing the size of a product.

It is noted that different configurations illustrated in the specification, other than the above configurations may be omitted as necessary. That is, the above configurations alone bring the aforementioned effect. However, the above configurations can additionally include at least one of the different configurations described in the Description as necessary; that is, the above configurations can additionally include the different configurations described in the Description, which are excluded from these configurations. Such additionally included configurations still bring the aforementioned effect.

According to the aforementioned embodiment, the heat dissipation mechanism includes a first heat dissipation block, the insulating layer 104, and the heat dissipation material 108. Here, the heat dissipation block 103 corresponds to the first heat dissipation block. The heat dissipation block 103 is connected to the lower surface of the lead electrode 102, the lower surface being more adjacent to the other-end side of the lead electrode 102 than the one end. The insulating layer 104 is at least partly connected to a lower surface of the heat dissipation block 103. The heat dissipation material 108 is connected to a lower surface of the insulating layer 104. In such a configuration, heat generated in the lead electrode 102, which is the external terminal, is transferred to the cooling mechanism 109 through the heat dissipation block 103, the insulating layer 104, and the heat dissipation material 108. This enables the lead electrode 102 to have a high heat dissipation capability.

According to the aforementioned embodiment, the insulating layer 104 includes a first portion disposed between the semiconductor element 100 and the cooling mechanism 109, and a second portion connected to the lower surface of the heat dissipation block 103. The first portion and the second portion are continuously formed. In such a configuration, heat generated in the semiconductor element 100 and heat generated in the lead electrode 102 are transferred, in common, to the cooling mechanism 109 through the insulating layer 104. This enables the semiconductor element 100 and the lead electrode 102 to have a high heat dissipation capability.

According to the aforementioned embodiment, the insulating layer includes a first portion disposed between the semiconductor element 100 and the cooling mechanism 109, and a second portion connected to a lower surface of the first heat dissipation block. Here, the insulating layer 104A corresponds to the first portion. Moreover, the heat dissipation block 103 corresponds to the first heat dissipation block. Moreover, the insulating layer 104B corresponds to the second portion. The insulating layer 104A and the insulating layer 104B are arranged to be spaced from each other. Further, the heat dissipation material includes a third portion connected to a lower surface of the insulating layer 104A, and a fourth portion connected to a lower surface of the insulating layer 104B. Here, the heat dissipation material 108A corresponds to the third portion. Moreover, the heat dissipation material 108B corresponds to the fourth portion. In such configuration, the insulating layer 104A and the insulating layer 104B are arranged to be spaced from each other; in addition, the heat dissipation material 108A and the heat dissipation material 108B are arranged to be spaced from each other. This enables a shape for fastening the external busbar to be changed by only changing a structure including the insulating layer 104B and the heat dissipation material 108B, independently of a structure on which the semiconductor element 100 is disposed, the structure including the insulating layer 104A and the heat dissipation material 108A. As a result, more flexible structure selection is achieved.

According to the aforementioned embodiment, the lead electrode 102A has the hole 200 penetrating from an upper surface of the lead electrode 102A to a lower surface of the lead electrode 102A. An upper surface of the heat dissipation block 103A has the screw hole 201 in a position superposed on the hole 200 of the lead electrode 102A in plan view. In such a configuration, heat generated from the lead electrode 102A itself during the passage of a current, and heat generated in a contact portion between the lead electrode 102A and the external busbar are dissipated to the cooling mechanism 109 through the heat dissipation block 103A, the insulating layer 104, and the heat dissipation material 108. This prevents a rise in temperature of the lead electrode 102A.

According to the aforementioned embodiment, the lead electrode 102B has a hole 202 penetrating from an upper surface of the lead electrode 102B to the lower surface of the lead electrode 102B. An upper surface of the heat dissipation block 103B has the projection 203 in a position superposed on the hole 202 of the lead electrode 102B. In such a configuration, heat generated from the lead electrode 102B itself during the passage of a current, and heat generated in a contact portion between the lead electrode 102B and the external busbar are dissipated to the cooling mechanism 109 through the heat dissipation block 103B, the insulating layer 104, and the heat dissipation material 108. This prevents a rise in temperature of the lead electrode 102B.

According to the aforementioned embodiment, the lead electrode 102A has the hole 200 penetrating from the upper surface of the lead electrode 102A to the lower surface of the lead electrode 102A. Further, the semiconductor device includes the nut 205 having the screw hole 206 in a position superposed on the hole 200 of the lead electrode 102A in plan view. The first heat dissipation block is connected at least to a lower surface of the nut 205. Here, the heat dissipation block 103C corresponds to the first heat dissipation block. In such a configuration, heat generated from the lead electrode 102A itself during the passage of a current, and heat generated in a contact portion between the lead electrode 102A and the external busbar are dissipated to the cooling mechanism 109 through the heat dissipation block 103C, the insulating layer 104B, and the heat dissipation material 108B. This prevents a rise in temperature of the lead electrode 102A. Further, the nut 205 is disposed in a location where the external busbar is fastened. This establishes a structure that is resistant under high torque, if any, in fastening to the external busbar.

According to the aforementioned embodiment, the first heat dissipation block is connected to a lower surface of the nut 205A and side surfaces of the nut 205A. Here, the heat dissipation block 103D corresponds to the first heat dissipation block. In such a configuration, heat generated from the lead electrode 102A itself during the passage of a current, and heat generated in a contact portion between the lead electrode 102A and the external busbar are dissipated to the cooling mechanism 109 through the nut 205A, the heat dissipation block 103D, the insulating layer 104B, and the heat dissipation material 108B. This prevents a rise in temperature of the lead electrode 102A. Further, the nut 205 is disposed in a location where the external busbar is fastened. This establishes a structure that is resistant under high torque, if any, in fastening to the external busbar. Still further, the heat dissipation block 103D, which is in contact with the side surfaces of the nut 205A in addition to the lower surface of the nut 205A, has a high dissipation capability.

According to the aforementioned embodiment, the semiconductor device includes the resin portion 112 provided to cover at least part of the nut 205 and the one end of the lead electrode 102A. In such a configuration, the semiconductor device, which is covered with the resin portion 112, has high reliability.

According to the aforementioned embodiment, the semiconductor device includes the busbar 111 having one end connected to an other-end side of the lead electrode 102A, and a second heat dissipation block connected to a lower surface of the busbar 111, the lower surface being more adjacent to an other-end side of the busbar 111 than the one end. Here, the heat dissipation block 110 corresponds to the second heat dissipation block. Further, a second portion of the insulating layer is connected also to a lower surface of the heat dissipation block 110. Here, the insulating layer 104C corresponds to the second portion. In such a configuration, the insulating layer 104C and the heat dissipation material 108C extend to reach the lower surface of busbar 111 and the lower surface of the heat dissipation block 110. This achieves efficient heat dissipation.

According to the aforementioned embodiment, the lead electrode 102C has the projection 207 on an other-end side of the lead electrode 102C. Further, the busbar 111A is welded to the projection 207 of the lead electrode 102C. Such a configuration enables heat to be dissipated from both upper and lower surfaces of the semiconductor element 100 to the cooling mechanism 109. In addition, heat generated from the lead electrode 102C itself during the passage of a current is dissipated to the cooling mechanism 109 through the heat dissipation block 103, the insulating layer 104, and the heat dissipation material 108. This prevents a rise in temperature of the lead electrode 102C.

According to the aforementioned embodiment, the semiconductor device includes the resin portion 112 provided to cover at least part of the first heat dissipation block and the one end of the lead electrode 102A. Here, the heat dissipation block 103A corresponds to the first heat dissipation block. In such a configuration, the semiconductor device, which is covered with the resin portion 112, has high reliability.

According to the aforementioned embodiment, the resin portion includes a fifth portion covering at least part of the first heat dissipation block, and a sixth portion covering the one end of the lead electrode 102A. Here, the heat dissipation block 103A corresponds to the first heat dissipation block. Moreover, the resin portion 112B corresponds to the fifth portion. Moreover, the resin portion 112A corresponds to the sixth portion. Further, the resin portion 112B and the resin portion 112A are arranged to be spaced from each other. In such a configuration, the semiconductor device, which is covered with the resin portion 112A and the resin portion 112B, has high reliability. Further, the resin portion 112A and the resin portion 112B are arranged to be spaced from each other. This enables the resin portion 112B to be provided in flexible response to a change of a structure including the insulating layer 104B and the heat dissipation material 108B, independently of a structure on which the semiconductor element 100 is disposed, the structure including insulating layer 104A and the heat dissipation material 108A. As a result, a shape for fastening the external busbar is flexibly changed.

According to the aforementioned embodiment, the heat dissipation mechanism includes the heat spreader 105A, a second insulating layer, and the heat dissipation material 108D. Here, the insulating layer 104E corresponds to the second insulating layer. The heat spreader 105A is connected to the lower surface of the semiconductor element 100, and connected to the lower surface of the lead electrode 102B with a first insulating layer of the insulating layer interposed therebetween. Here, the insulating layer 104D corresponds to the first insulating layer. The insulating layer 104E is connected to a lower surface of the heat spreader 105A. The heat dissipation material 108D is connected to a lower surface of the insulating layer 104E. Such a configuration enables heat to be dissipated from both upper and lower surfaces of the semiconductor element 100 to the cooling mechanism 109. In addition, heat generated from the lead electrode 102B itself during the passage of a current is dissipated to the cooling mechanism 109 through the insulating layer 104D, the heat spreader 105A, the insulating layer 104E, and the heat dissipation material 108D. This prevents a rise in temperature of the lead electrode 102B.

According to the aforementioned embodiment, the lower surface of the lead electrode 102B, which is connected to the heat spreader 105A, is provided to be bent toward the heat spreader 105A. The lead electrode 102B can have one height in a location where the lead electrode 102B is connected to the semiconductor element 100, and have another height in a location where the lead electrode 102B is connected to the heat spreader 105A. The aforementioned configuration enables the semiconductor element 100 to be properly connected to the heat spreader 105A by adjusting the shape of the lead electrode 1028, which is bent toward the heat spreader 105A, as necessary.

According to the aforementioned embodiment, the semiconductor device includes the heat dissipation block 103E directly connected to the lower surface of the lead electrode 102, the lower surface being more adjacent to the other-end side of the lead electrode 102 than the one end. Further, the heat spreader 105B is connected to the lower surface of the lead electrode 102 with the heat dissipation block 103E and the first insulating layer interposed therebetween. Here, the insulating layer 104F corresponds to the first insulating layer. In such a configuration, heat generated from the lead electrode 102 itself during the passage of a current is dissipated to the cooling mechanism 109 through the heat dissipation block 103E, the insulating layer 104F, the heat spreader 105B, the insulating layer 104G, and the heat dissipation material 108E.

Modifications of Aforementioned Embodiments

The material quality, material, size, and shape of each component, the positions of components relative to each other, and conditions for implementation, described in each of the aforementioned embodiments are illustrative in all aspects. Thus, they are not limited to what are described in the Description. Accordingly, numerous variations not shown can be assumed within the range of the technique disclosed in the Description. Examples of the variations include the modification, addition and omission of at least one component. Another example is extracting at least one component from at least one of the embodiments and then combining the extracted component with another component of a different embodiment.

Unless otherwise contradicted, "one" component described in each of the embodiments may include "one or more" components. Further, individual components are conceptual units. Thus, one component may include multiple structures, one component may correspond to a part of some structure, and multiple components may be included in one structure. Each component includes a structure of a different configuration or a different shape as long as the structure of the different configuration or the different shape achieves the same function.

What has been described in the Description are referred for all purposes regarding the present technique. It is thus not an admission that any of the descriptions provided herein are conventional techniques.

If the aforementioned embodiments contain descriptions about materials that are not particularly specified, it is to be understood that an example of these materials is an alloy containing other additives within these materials unless otherwise contradicted.

EXPLANATION OF REFERENCE SIGNS 100 semiconductor element, 101, 107 solder, 102, 102A, 102B, 102C, 106 lead electrode, 103, 103A, 103B, 103C, 103D, 103E, 110 heat dissipation block, 104, 104A, 104B, 104C, 104D, 104E, 104F, 104G, 104H insulating layer, 105, 105A, 105B heat spreader, 108, 108A, 108B, 108C, 108D, 108E, 108F heat dissipation material, 109 cooling mechanism, 111, 111A busbar, 112, 112A, 112B resin portion, 200, 202, 204 hole, 201, 206, 206A screw hole, 203, 207 projection, and 205,205A nut.

The invention claimed is:

1. A semiconductor device comprising:
a semiconductor element;
a lead electrode comprising a lower surface connected to an upper surface of the semiconductor element at one end of the lead electrode;
a cooling mechanism disposed on a lower surface side of the semiconductor element; and
a heat dissipation mechanism provided to be thermally joined between the lower surface of the lead electrode, the lower surface being more adjacent to an other-end side of the lead electrode than the one end, and the cooling mechanism, the heat dissipation mechanism comprising at least one insulating layer,
wherein the heat dissipation mechanism comprises
a first heat dissipation block connected to the lower surface of the lead electrode, the lower surface being more adjacent to the other-end side than the one end, the insulating layer at least partly connected to a lower surface of the first heat dissipation block, and
a heat dissipation material connected to a lower surface of the insulating layer,
wherein the lead electrode comprises a hole penetrating from an upper surface of the lead electrode to the lower surface of the lead electrode, and
wherein an upper surface of the first heat dissipation block comprises a screw hole in a position superposed on the hole of the lead electrode in plan view.

2. The semiconductor device according to claim 1, wherein the insulating layer comprises
a first portion disposed between the semiconductor element and the cooling mechanism, and
a second portion connected to the lower surface of the first heat dissipation block, and
wherein the first portion and the second portion are continuously formed.

3. The semiconductor device according to claim 1, wherein the insulating layer comprises
a first portion disposed between the semiconductor element and the cooling mechanism, and
a second portion connected to the lower surface of the first heat dissipation block,
wherein the first portion and the second portion are arranged to be spaced from each other, and
wherein the heat dissipation material comprises
a third portion connected to a lower surface of the first portion, and
a fourth portion connected to a lower surface of the second portion.

4. The semiconductor device according to claim 1, wherein the semiconductor device further comprises a nut comprising the screw hole in a position superposed on the hole of the lead electrode in plan view, and
wherein the first heat dissipation block is connected at least to a lower surface of the nut.

5. The semiconductor device according to claim 4, wherein the first heat dissipation block is connected to the lower surface of the nut and side surfaces of the nut.

6. The semiconductor device according to claim 4, further comprising a resin portion provided to cover at least part of the nut and the one end of the lead electrode.

7. The semiconductor device according to claim 2, further comprising:
a busbar comprising one end connected to the other-end side of the lead electrode; and
a second heat dissipation block connected to a lower surface of the busbar, the lower surface being more adjacent to an other-end side of the busbar than the one end of the busbar,
wherein the second portion of the insulating layer is connected also to a lower surface of the second heat dissipation block.

8. The semiconductor device according to claim 7, wherein the other-end side of the lead electrode comprises a projection, and
wherein the busbar is welded to the projection of the lead electrode.

9. The semiconductor device according to claim 1, further comprising a resin portion provided to cover at least part of the first heat dissipation block and the one end of the lead electrode.

10. The semiconductor device according to claim 9, wherein the resin portion comprises
a fifth portion covering at least the part of the first heat dissipation block, and
a sixth portion covering the one end of the lead electrode, and
wherein the fifth portion and the sixth portion are arranged to be spaced from each other.

11. The semiconductor device according to claim 1, wherein the heat dissipation mechanism comprises
a heat spreader connected to a lower surface of the semiconductor element, and connected to the lower surface of the lead electrode with a first insulating layer of the insulating layer interposed therebetween,
a second insulating layer connected to a lower surface of the heat spreader, and
a heat dissipation material connected to a lower surface of the second insulating layer.

12. The semiconductor device according to claim 11, wherein the lower surface of the lead electrode, which is connected to the heat spreader, is provided to be bent toward the heat spreader.

13. The semiconductor device according to claim 11, further comprising a heat dissipation block directly connected to the lower surface of the lead electrode, the lower surface being more adjacent to the other-end side than the one side, wherein the heat spreader is connected to the lower surface of the lead electrode with the heat dissipation block and the first insulating layer interposed therebetween.

\* \* \* \* \*